United States Patent
Tanaka et al.

(10) Patent No.: US 8,519,796 B2
(45) Date of Patent: Aug. 27, 2013

(54) BIAS GENERATION CIRCUIT, POWER AMPLIFIER MODULE, AND SEMICONDUCTOR DEVICE

(75) Inventors: Satoshi Tanaka, Kanagawa (JP); Fuminori Morisawa, Kanagawa (JP); Makoto Tabei, Kanagawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/383,976

(22) PCT Filed: Sep. 30, 2009

(86) PCT No.: PCT/JP2009/067088
§ 371 (c)(1),
(2), (4) Date: Jan. 13, 2012

(87) PCT Pub. No.: WO2011/039871
PCT Pub. Date: Apr. 7, 2011

(65) Prior Publication Data
US 2012/0176198 A1    Jul. 12, 2012

(51) Int. Cl.
*H03F 3/04*    (2006.01)
(52) U.S. Cl.
USPC .......................................... 330/296; 323/315
(58) Field of Classification Search
USPC ................. 330/296, 285, 288; 323/315, 316
See application file for complete search history.

(56) References Cited

U.S. PATENT DOCUMENTS

| | | | | |
|---|---|---|---|---|
| 5,966,005 | A | * | 10/1999 | Fujimori ........................ 323/315 |
| 7,915,948 | B2 | * | 3/2011 | Nishimura ..................... 327/524 |
| 2004/0090267 | A1 | | 5/2004 | Nagamori et al. |
| 2005/0168281 | A1 | | 8/2005 | Nagamori et al. |

FOREIGN PATENT DOCUMENTS

| | | |
|---|---|---|
| JP | 1-140315 | 6/1989 |
| JP | 1-401315 | 9/1989 |
| JP | 2001-237656 | 8/2001 |
| JP | 2004-159123 | 6/2004 |

OTHER PUBLICATIONS

K. Watanabe, "A Practical Method of Designing Analogue Electronic Circuit"; p. 132; Fig. 6.1; published by Sogo Denshi Syuppansha; ISBN4-915449-83-1; 1996.

* cited by examiner

*Primary Examiner* — Henry Choe
(74) *Attorney, Agent, or Firm* — Mattingly & Malur, PC

(57) ABSTRACT

There is provided a bias circuit including a power amplifier in which influence of variation of a gate length L is reduced and variation of a gain among products is low. Two NPN- and PNP-type current mirror circuits 101 (NPN type) and 102 (PNP type) are inserted on an input side of a bias circuit 103. It is designed that a gate length of a transistor Q1 on an output side of the current mirror circuit 101 is longer than that of the other transistor. In this manner, even when an error is generated, influence of the error can be suppressed to be small.

16 Claims, 7 Drawing Sheets

BIAS GENERATION CIRCUIT, POWER AMPLIFIER MODULE, AND SEMICONDUCTOR DEVICE

TECHNICAL FIELD

The present invention relates to a method of correcting variation among products of a power amplifier module which performs multistage amplification, and, more particularly, the present invention relates to suppression of variation among products of a bias circuit due to variation among gate lengths of a transistor (a MOSFET in many cases).

BACKGROUND ART

A wireless transceiver is widely and generally used. In a mobile phone which uses the wireless transceiver, a UMTS (W-CDMA) system with using a CDMA (Code Division Multiple Access) and a GSM with using a TDMA (Time Division Multiple Access) system as a multiple access system are main systems.

In a UMTS/GSM multimode PA module which supports both of the UMTS and GSM, suppression of gain variation among products has been a critical problem.

As a technique of stabilizing a gain of a conventional PA module, a technique of adjusting a value of an external resistor in accordance with process variation is cited.

As a prior art for compensating the variation in the manufacture, a technology disclosed in Japanese Patent Application Laid-Open Publication No. 2001-237656 (Patent Document 1) can be cited.

Further, "A Practical Method of Designing Analogue Electronic Circuit" (Non-Patent Document 1), page 132, FIG. 6.1 discloses a technique of adjusting an amount of a current flowing through a bias circuit by a current mirror circuit.

FIG. 1 is a circuit diagram showing the configuration of the bias circuit described in this Non-Patent Document 1.

The current mirror circuit of this diagram is a circuit controlled to flow a current defined by a ratio of a threshold voltage of a FET with respect to a constant current source "$I_{REF}$". In this case, the following formula is obtained.

$$I_{REF} = \beta \times (V_G + V_{th})^2 \qquad \text{[Formula 1]}$$

An above-described relation is established. Here, "$V_{th}$" is a threshold voltage of a MOSFET configuring the current mirror circuit. Further, "$\beta$" represents a coefficient described later. This formula is modified as follows.

$$V_{G1} = \sqrt{\frac{I_{REF}}{\beta}} + V_{tl} \qquad \text{[Formula 2]}$$

An above-described relation is established. When a transconductance (current/voltage conversion gain) "gm" of an FET transistor "To" is obtained from these relations, the following formula is obtained.

$$gm = 2 \times \beta \times (V_{G1} - V_{th}) \qquad \text{[Formula 3]}$$

$$= 2 \times \sqrt{\beta} \times (I_{REF})^{\frac{1}{2}}$$

Here, "n" represents a gate-width ratio of a reference FET with respect to the FET transistor To.

PRIOR ART DOCUMENTS

Patent Document

Patent Document 1: Japanese Patent Application Laid-Open Publication No. 2001-237656

Non-Patent Document

Non-Patent Document 1: A Practical Method of Designing Analogue Electronic Circuit, written by Kazuo Watanabe, published by Sogo Denshi Syuppansha (Publishing company) ISBN4-915449-83-1

DISCLOSURE OF THE INVENTION

Problems to be Solved by the Invention

However, in a system of performing the adjustment in accordance with the process variation at mounting, there is a problem that a uniformed instruction cannot be made when the manufacture is outsourced.

Also, there is a problem even in the method described in the Non-Patent Document 1.

In the [Formula 1], a coefficient $\beta$ appears. If this coefficient is expressed by a formula, the formula is as the following two formulas.

$$\beta \propto \frac{W}{L} \times \mu \times C_{ox} \qquad \text{[Formula 4]}$$

$$\mu \propto f(T) \qquad \text{[Formula 5]}$$

Here, "W" in the [Formula 4] represents the gate width of the MOSFET configuring the current mirror circuit, "L" represents a gate length of the MOSFET, "$\mu$" represents mobility, and "$C_{ox}$" represents a gate oxide film capacitance. From the [Formula 3], it can be understood that the transconductance "gm" is varied by the variation of the values such as W, L, and $C_{ox}$ due to the process variation of the device.

Further, from the [Formula 5], it is understood that the mobility "$\mu$" depends on the absolute temperature "T".

Among these values, by setting a large value for the gate width "W" contained in the numerator of the [Formula 4], accuracy can be increased. Further, the "$C_{ox}$" is determined by a thickness of the oxide film, and therefore, is not relatively affected by the process variation.

Meanwhile, for the mobility in the [Formula 5], the temperature characteristic can be given to the current by other means.

Therefore, due to the influence of the variation of the gate length "L" which does not have security (supporting) means, there has been a problem that the transconductance "gm" cannot be maintained constant even if the current is maintained constant.

Further, by simply increasing an amplification factor of the output-side transistor To of the bias circuit, the frequency characteristic is merely deteriorated.

A preferred aim of the present invention is to provide a bias circuit of a power amplifier in which the influence of the variation of this gate length "L" is reduced to provide low gain variation among products.

The above and other preferred aims and novel characteristics of the present invention will be apparent from the description of the present specification and the accompanying drawings.

Means for Solving the Problems

The typical ones of the inventions disclosed in the present application will be briefly described as follows.

A bias generation circuit according to a typical embodiment of the present invention has a feature that the bias generation circuit includes: a first current mirror circuit configured of a pair of NPN type transistors connected thereto; and a bias circuit operated based on an output current of this first current mirror circuit, and a feature that a constant current is inputted to a collector terminal of a first transistor configuring the first current mirror circuit, and an input current to the bias circuit is outputted from a collector terminal of a second transistor configuring the first current mirror circuit. And, it has a feature that a gate length of a base terminal of the second transistor is longer than a gate length of a base terminal of the first transistor.

This bias generation circuit may have a feature that an output current of the second transistor is inputted to the bias circuit through a second current mirror circuit.

Another bias generation circuit according to the typical embodiment of the present invention has a feature that the bias generation circuit includes: a first current mirror circuit configured of a pair of NPN type transistors; a second current mirror circuit configured of a pair of PNP type transistors; and a bias circuit operated based on an output current of the second current mirror circuit, and a feature that a constant current is inputted to a collector terminal of a first transistor configuring the first current mirror circuit, an input current to the second current mirror circuit is outputted from a collector terminal of a second transistor configuring the first current mirror circuit, an output of the second transistor configuring the first current mirror circuit is inputted to a collector terminal of a third transistor configuring the second current mirror circuit, and an input current to the bias circuit is outputted from a collector terminal of a fourth transistor configuring the second current mirror circuit. And, it has a feature that a gate length of a base terminal of the second transistor and a gate length of a base terminal of the fourth transistor are longer than a gate length of a base terminal of the first transistor and a gate length of a base terminal of the third transistor.

This bias generation circuit may have features that an output current of the second transistor is inputted to the second current mirror circuit through a third current mirror circuit and that an output current of the fourth transistor is inputted to the bias circuit through a fourth current mirror circuit.

A power amplifier module according to the typical embodiment of the present invention has features that a first amplifier, a second amplifier, and a third amplifier are connected in series, that a first bias generation circuit is arranged between the first amplifier and the second amplifier and a second bias generation circuit is arranged between the second amplifier and the third amplifier, and that the bias generation circuit according to the present invention is used as either one or both of the first bias generation circuit and the second bias generation circuit.

Also, another power amplifier module according to the typical embodiment of the present invention has features that a first amplifier, a second amplifier, and a third amplifier are connected in series, that a bias generation circuit is arranged between the first amplifier and the second amplifier or between the second amplifier and the third amplifier, and that the bias generation circuit according to the present invention is used as this bias generation circuit.

A semiconductor device including such a power amplifier module is also within a scope of the present invention.

Effects of the Invention

The effects obtained by typical aspects of the present invention disclosed in the present application will be briefly described as follows.

In the bias circuit of the power amplifier according to the typical embodiment of the present invention, the bias is set by applying the current mirror circuit so that the transconductance gm on the FET side having a long gate length resulting in the relatively small variation of the transconductance gm can equivalently appear as the transconductance gm of the FET having a short gate length. In this manner, a gain deviation due to the gate length which is a main cause of the variation can be suppressed.

BRIEF DESCRIPTIONS OF THE DRAWINGS

BEST MODE FOR CARRYING OUT THE INVENTION

Hereinafter, the embodiments of the present invention are described with reference to diagrams.

First Embodiment

Figure 1:
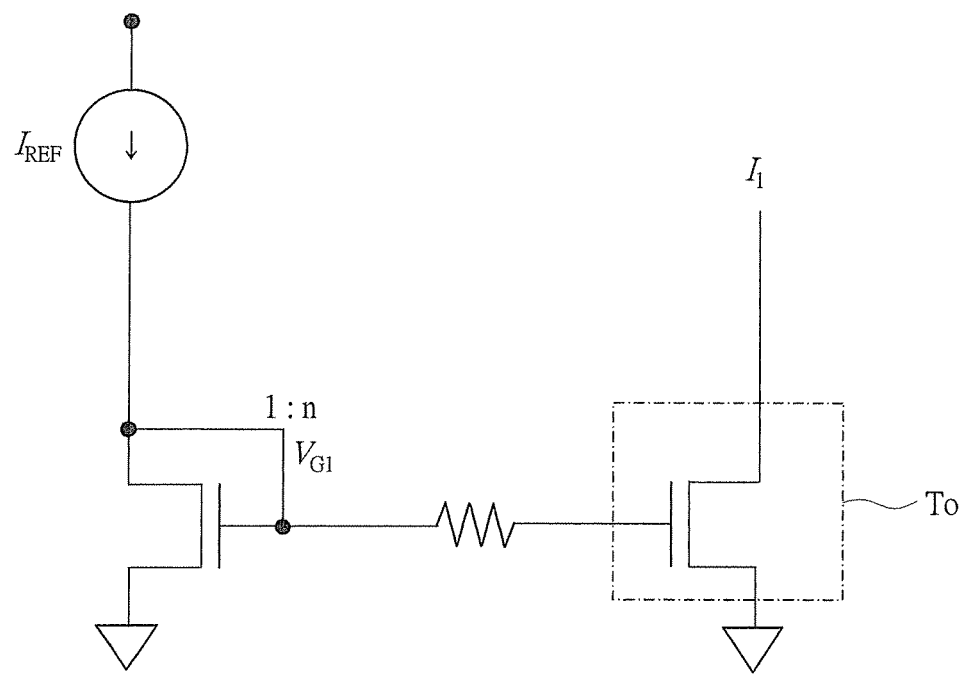
FIG. 1 is a circuit diagram showing a configuration of a bias generation circuit described in Non-Patent Document 1.
Figure 2:
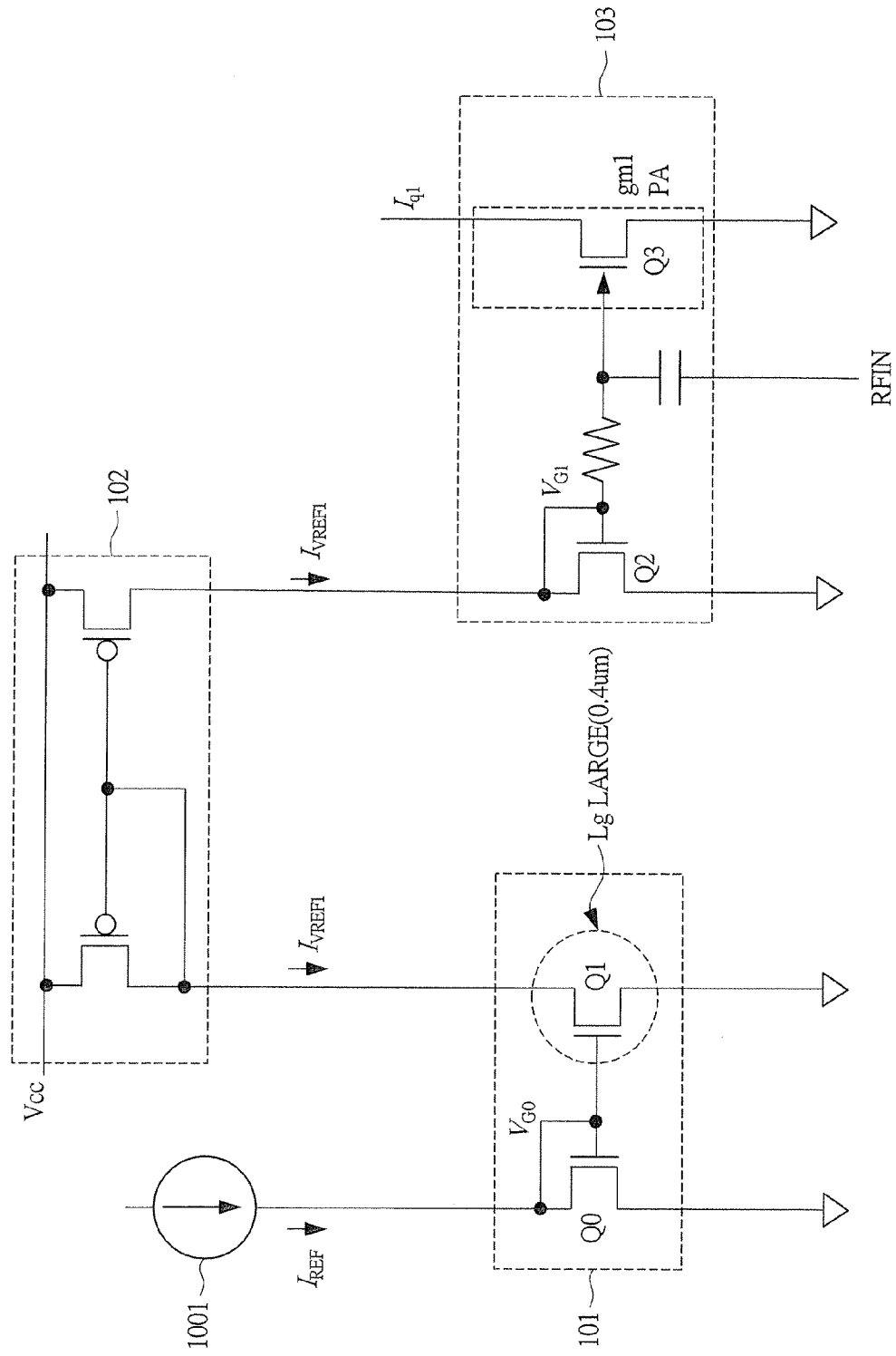
FIG. 2 is a circuit diagram showing a configuration of a bias generation circuit according to a first embodiment of the present invention.

FIG. 2 is a circuit diagram showing a configuration of a bias generation circuit according to a first embodiment of the present invention.

The present bias circuit has a feature that current mirror circuits 101 and 102 are added to a previous stage of a bias circuit 103. First, these circuits will be described.

The current mirror circuit 101 is a constant current circuit for carrying a current of a constant current source 1001 to an input of the current mirror circuit 102. The embodiment has a feature that a gate length "Lg" of a MOSFET configuring this current mirror circuit 101 is longer than a gate length "Lo" of other MOSFET used in the present circuit.

The current mirror circuit 102 is a constant current circuit which outputs an output current of the current mirror circuit 101, that is, an output current of the constant current source 1001 to the bias circuit 103. As shown in the diagram, the current mirror circuit 101 is configured of a NPN type, and the current mirror circuit 102 is configured of a PNP type. It is assumed that all of threshold voltages of the MOSFETs configuring these current mirror circuits are commonly "$V_{th}$".

The constant current source 1001 is a constant current source which supplies a reference current "$I_{ref}$". A current value outputted by this constant current source 1001 is inputted to the bias circuit 103.

An operation of the bias circuit of the present invention configured of these various configurations is described.

First, the reference current $I_{ref}$ of the constant current source 1001 can be defined as follows.

$$I_{ref} = \beta_0 \times (V_{G0} - V_{th})^2 \qquad \text{[Formula 6]}$$

Here, "$\beta_0$" represents a coefficient of a transistor "Q0" which is included in the current mirror circuit 101. Also, "$V_{G0}$" represents a potential of the base terminal of the current mirror circuit 101, and "$V_{th}$" represents a threshold voltage of the transistor Q0.

Meanwhile, a current "$I_{vref1}$" outputted by the current mirror circuit 101 adopts the following formula.

$$I_{ref1} = \beta_1 \times (V_{G0} - V_{th})^2 \qquad \text{[Formula 7]}$$

Here, "$\beta_1$" represents a coefficient of a transistor "Q1" which is included in the current mirror circuit 101. Here, the embodiment has a feature that the transistor Q0 and the transistor Q1 are different from each other in a length (gate length) of the gate terminal. That is, a gate length "$L_{g1}$" of the transistor Q1 is longer than a gate length "$L_{g0}$" of the transistor Q0.

Both of the coefficients $\beta_1$ and $\beta_2$ are controlled by the [Formula 4]. And, the [Formula 4] is controlled by the gate length of each transistor.

Therefore, even if the base potential $V_{G0}$ is common, characteristics of the coefficients $\beta_1$ and $\beta_2$ are different from each other because of the difference in the gate length.

The current $I_{vref1}$ is obtained from these [Formula 6] and [Formula 7] as follow.

$$I_{vref1} = \frac{\beta_1}{\beta_0} \times I_{ref} \qquad \text{[Formula 8]}$$

The current $I_{vref1}$ is inputted to the bias circuit 103 by the current mirror circuit 102.

Therefore, the following formula is established.

$$I_{vref1} = \beta_0 \times (V_{G0} - V_{th})^2 \qquad \text{[Formula 9]}$$

That is, it is assumed that the gate length of a transistor Q2 used in this bias circuit 103 is equal to the gate length of the transistor Q0 of the current mirror circuit 101.

A transconductance gm1 at the gate voltage of the bias circuit 103 is obtained as follows by substituting the [Formula 8].

$$\begin{aligned} gm1 &= 2n \times \beta_0 \times (V_{G1} - V_{th}) \qquad \text{[Formula 10]} \\ &= 2n \times \beta_0 \times \sqrt{\frac{I_{vref1}}{\beta_0}} \\ &= 2n \times \sqrt{\beta_0 \times I_{vref1}} \\ &= 2n \times \sqrt{\beta_0 \times \left(\frac{\beta_1}{\beta_0} \times I_{ref}\right)} \end{aligned}$$

-continued $$= 2n \times \sqrt{\beta_1 \times I_{ref}}$$

As described above, the transconductance can be determined by the transistor Q1 having the long gate length. As a result, a bias generation circuit which is robust to the variation of the coefficient $\beta$ determined depending on the variation of the gate length in the manufacture stage can be configured.

Second Embodiment

Next, a second embodiment of the present invention is described with reference to the diagrams.

Figure 3:
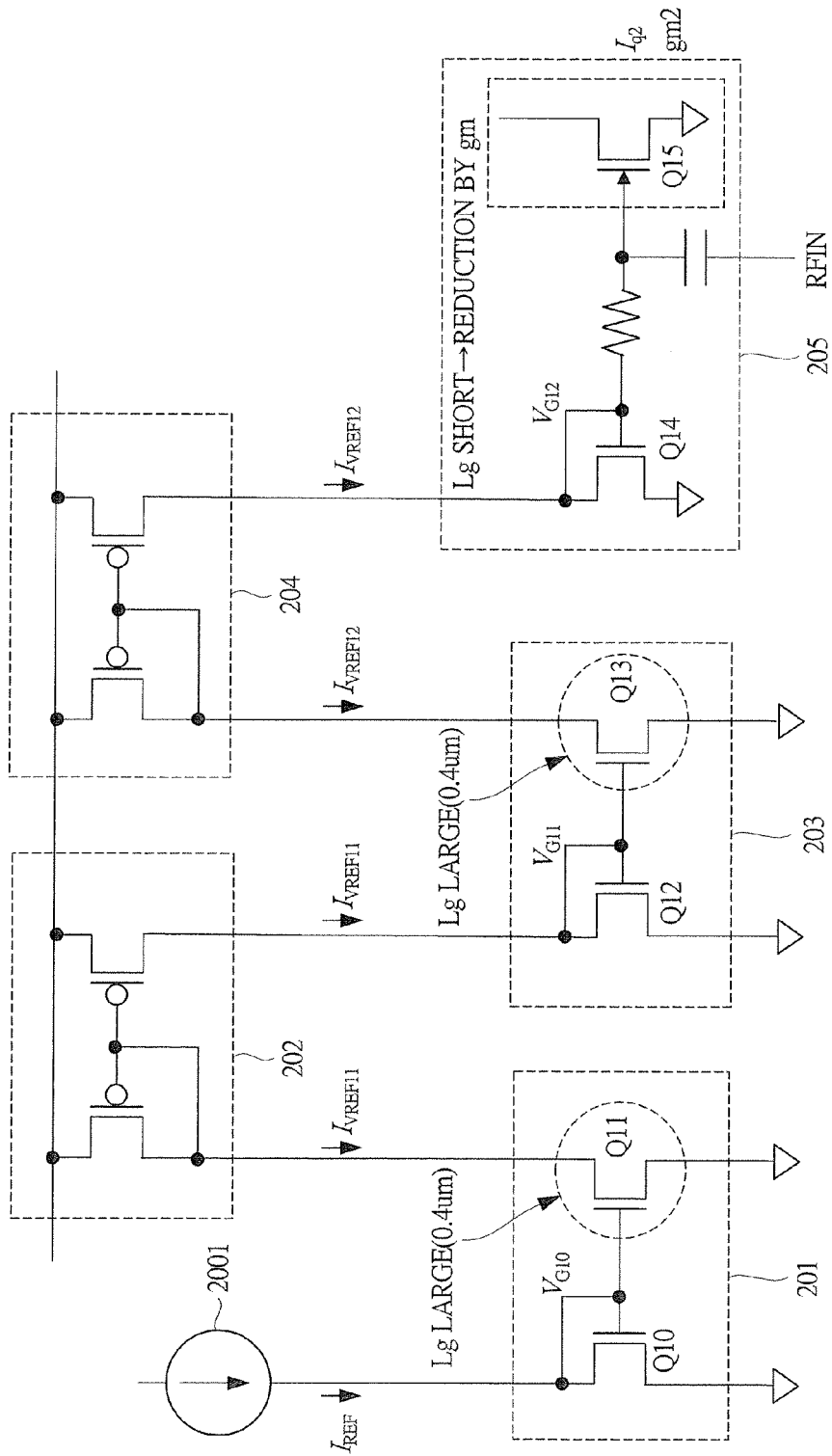
FIG. 3 is a circuit diagram showing a configuration of a bias generation circuit according to a second embodiment of the present invention.

FIG. 3 is a circuit diagram showing a configuration of a bias generation circuit according to a second embodiment of the present invention.

This bias generation circuit has a feature that current mirror circuits 201, 202, 203, and 204 are added on an input side of a bias circuit 205.

The current mirror circuit 201 is a constant current circuit for carrying a current of a constant current source 2001 to an input of the current mirror circuit 202.

This current mirror circuit 201 corresponds to the current mirror circuit 101 of the first embodiment. That is, the gate lengths of transistors Q10 and Q11 configuring the current mirror circuit 201 are different from each other. The gate length of the transistor Q11 is longer than the gate length "$L_{g0}$" of the transistor Q10.

An operation of this current mirror circuit 201 is the same operation of the first embodiment expressed by the [Formula 6] to [Formula 8]. Note that a reference current of the constant current source 2001 is represented by $I_{ref}$ similarly to the first embodiment. Also, a current "$I_{vref11}$" is used as an output of the current mirror circuit 201. Further, a potential of a base terminal of the current mirror circuit 201 is represented by "$V_{G10}$". Still further, a coefficient "$\beta_{10}$" represents a coefficient of the transistor $Q_{10}$ inside the current mirror circuit 201, and a coefficient "$\beta_{11}$" represents a coefficient of the transistor $Q_{11}$ inside the current mirror circuit 201.

$$I_{ref} = \beta_{10} \times (V_{G10} - V_{th})^2 \qquad \text{[Formula 11]}$$

$$I_{vref11} = \beta_{11} \times (V_{G10} - V_{th})^2 \qquad \text{[Formula 12]}$$

$$I_{vref11} = \frac{\beta_{11}}{\beta_{10}} \times I_{ref} \qquad \text{[Formula 13]}$$

The current mirror circuit 202 is a constant current circuit for carrying the current $I_{vref11}$ being the output of the current mirror circuit 201 to an input of the current mirror circuit 203. The current mirror circuit 202 is configured of a PNP type transistor.

The current mirror circuit 203 is a current mirror circuit having a configuration in which the gate lengths of the NPN type transistors Q12 and Q13 are different from each other similarly to the current mirror circuit 201 and the current mirror circuit 101 of the first embodiment.

An operation of this current mirror circuit is also the same operation of the first embodiment expressed by the [Formula 6] to the [Formula 8]. A current "$I_{vref12}$" is used as an output of the current mirror circuit 203. Also, a potential of a base terminal of the current mirror 203 is represented by "$V_{G11}$". Further, a coefficient "$\beta_{12}$" represents a coefficient of the transistor $Q_{12}$ inside the current mirror circuit 203, and a coefficient "$\beta_{13}$" represents a coefficient of the transistor $Q_{13}$ inside the current mirror circuit 203. Note that threshold voltages of the transistors $Q_{12}$ and $Q_{13}$ are represented by "$V_{th1}$".

$$I_{vref11} = \beta_{12} \times (V_{G11} - V_{th})_1^2 \quad \text{[Formula 14]}$$

$$I_{vref12} = \beta_{13} \times (V_{G11} - V_{th})_1^2 \quad \text{[Formula 15]}$$

$$I_{vref12} = \frac{\beta_{13}}{\beta_{12}} \times I_{vref11} = \frac{\beta_{13}}{\beta_{12}} \times \frac{\beta_{11}}{\beta_{10}} \times I_{ref} \quad \text{[Formula 16]}$$

Here, from a correspondence relation among the gate lengths, it is assumed that the transistor $Q_{10}$ inside the current mirror circuit 201 and the transistor $Q_{12}$ inside the current mirror circuit 203 have the same characteristics as each other, and that the transistor $Q_{11}$ inside the current mirror circuit 201 and the transistor $Q_{13}$ inside the current mirror circuit 203 have the same characteristics as each other ($\beta_{10} = \beta_{12}$ and $\beta_{11} = \beta_{13}$). Under these conditions, the [Formula 16] can be modified as follows.

$$I_{vref12} = \left(\frac{\beta_{11}}{\beta_{10}}\right)^2 \times I_{ref} \quad \text{[Formula 17]}$$

The current mirror circuit 204 is a constant current circuit for carrying the current $I_{vref12}$ being an output of the current mirror circuit 203 to an input of the bias circuit 205.

The bias circuit 205 is a bias circuit having the same configuration as that of the bias circuit 103 according to the first embodiment.

An operation of the transistor $Q_{14}$ inside this bias circuit 205 is shown as follows by using the current $I_{vref12}$ to be inputted. Note that a threshold voltage of the transistor $Q_{14}$ is represented by "$V_{th2}$", and a coefficient thereof is represented by "$\beta_{14}$". Also, a voltage of a base terminal of the transistor $Q_{14}$ is represented by "$V_{G12}$".

$$I_{vref12} = \beta_{14} \times (V_{G12} - V_{th})_2^2 \quad \text{[Formula 18]}$$

From the [Formula 17] and the [Formula 18], a transconductance "gm2" at the gate voltage of the transistor Q14 is obtained as follows.

$$\begin{aligned} gm2 &= 2n \times \beta_{14} \times (V_{G12} - V_{th2}) \quad \text{[Formula 19]} \\ &= 2n \times \beta_{14} \times \sqrt{\frac{I_{vref12}}{\beta_{14}}} \\ &= 2n \times \sqrt{\beta_{14}} \times \sqrt{I_{vref12}} \\ &= 2n \times \sqrt{\beta_{14}} \times \frac{\beta_{11}}{\beta_{10}} \times \sqrt{I_{ref}} \end{aligned}$$

When it is assumed to design the gate length of the transistor Q14 as same as the gate lengths of the transistors Q10 and Q12, a relation of "$\beta 10 = \beta 14$" is obtained.

$$gm2 = 2n \times \frac{\beta_{11}}{\sqrt{\beta_{10}}} \times \sqrt{I_{ref}} \quad \text{[Formula 20]}$$

Normally, when the gate length Lg is short, the transconductance gm is large. However, as obviously seen from the [Formula 20], by adopting the present embodiment, a bias conversely having the small transconductance gm2 can be obtained when the gate lengths Lg of the transistors Q11, Q13 and, others are short.

When the power amplifier module is configured of a plurality of bias circuits, by applying the bias circuit according to the present embodiment to a first stage, the sensitivity of the transconductance gm from the entire amplifier circuit is cancelled, so that an amplifier having a constant gain can be achieved.

In the foregoing, the invention made by the present inventors has been concretely described based on the embodiments. However, it is needless to say that the present invention is not limited to the foregoing embodiments and various modifications and alterations can be made within the scope of the present invention.

INDUSTRIAL APPLICABILITY

Lastly, application examples of the present invention are described.

First Application Example

As described in the second embodiment, the power amplifier module configured of the plurality of bias circuits in a series multistage is described in the present example.

Figure 4:
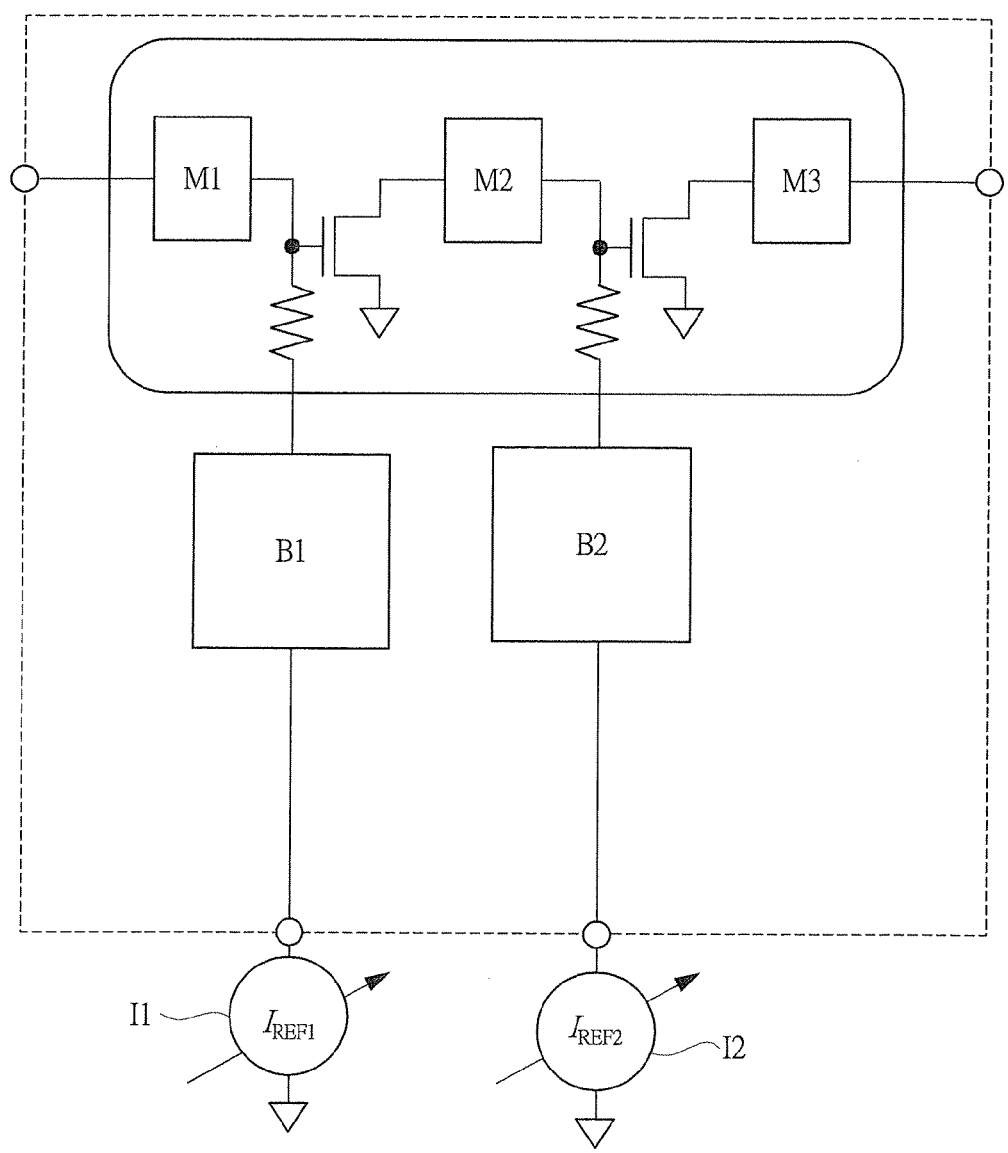
FIG. 4 is a configuration diagram showing a configuration of a power amplifier module to which the first embodiment or the second embodiment of the present invention is applied.
Figure 5A:
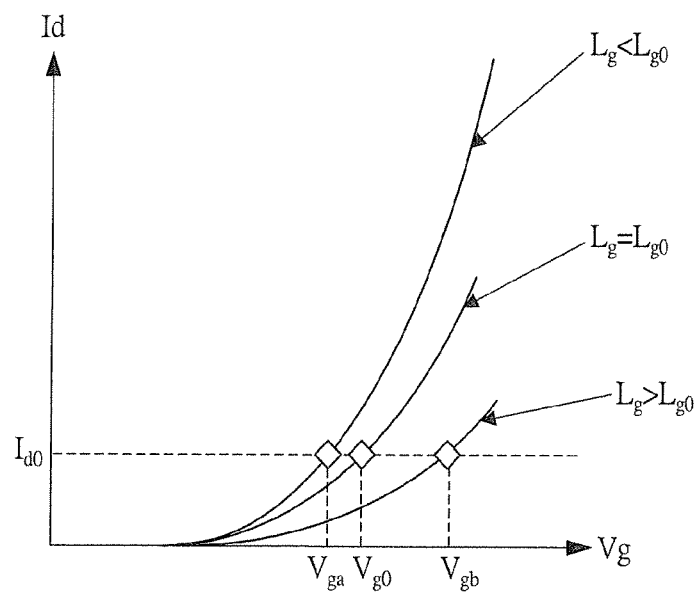
FIGS. 5A and 5B are conceptual diagrams each showing movement of a bias point of a transistor in an amplifier stage of the power amplifier of FIG. 4.
Figure 5B:
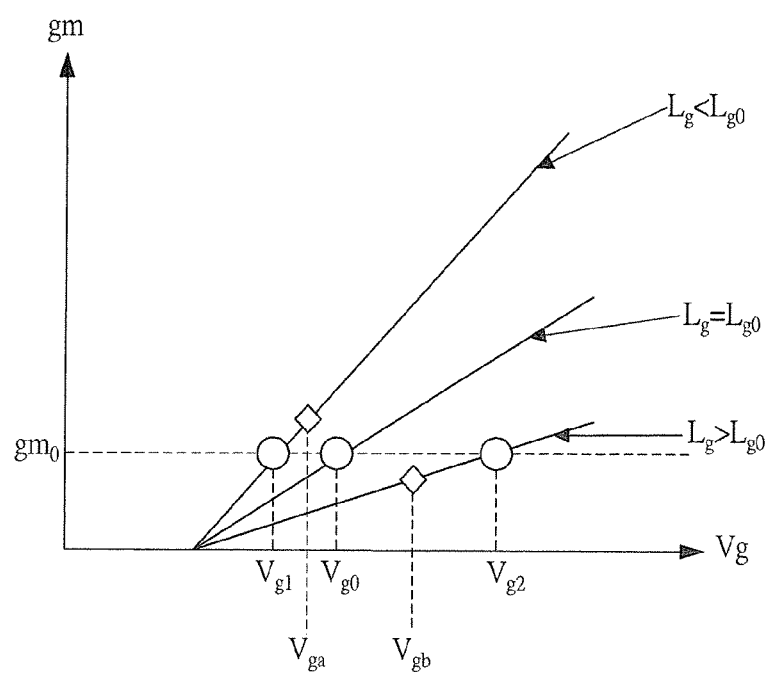

FIG. 4 is a configuration diagram showing a configuration of a power amplifier module to which the first embodiment or the second embodiment of the present invention is applied. And, FIGS. 5A and 5B are conceptual diagrams each showing movement of a bias point of a transistor in an amplifier stage when the first embodiment is applied thereto. Note that FIG. 5A is a graph showing correspondence between a voltage and a current, and FIG. 5B is a graph showing correspondence between a voltage and a transconductance.

An amplifier circuit shown in FIG. 4 is configured of amplifiers M1, M2, and M3, and bias circuits B1 and B2.

In the present application example, the bias circuits B1 and B2 are controlled by independent current sources $I_{REF1}$ and $I_{REF2}$. In these bias circuits, detailed bias control such as the temperature characteristic in each stage is achieved.

It is considered that the bias circuits of the first embodiment and the second embodiment of the present invention are applied to these bias circuits B1 and B2. At this time, if the bias circuits of the present invention are applied to both of these circuits, it is preferred to apply the first bias circuit to both of these circuits. Alternatively, if they are applied to either one of these circuits, it is preferred to apply that of the second embodiment of the present invention to the bias circuit B2.

Next, a behavior in the present application example is described with reference to FIGS. 5A and 5B.

When a device is mounted on a semiconductor substrate as a MOSFET, the variation among the respective devices is constant in many cases. Therefore, the behavior is explained as assuming that the gate length Lg of each transistor in the above-described embodiments has a constant variation in all of the transistors.

Each of FIGS. 5A and 5B shows a relation between a default (design center) value "$Lg_0$" of the gate length and an actual gate length "Lg", and three change lines are shown in each diagram.

When the gate length Lg of the transistor changes, as shown in FIG. 5A, current drive performance is higher as the gate length Lg is shorter, and therefore, a large amount of current flows. It is assume that, in a case of the gate length of Lg$_0$, a gate voltage "Vg$_0$" is applied to carry a current "I$_{d0}$" so that a transconductance "gm$_0$" is obtained.

In a case of a bias obtained by a conventional current mirror circuit, an operation for maintaining the bias current constant as the current I$_{do0}$ is performed. Therefore, when the gate length Lg is varied due to the variation for each product, the bias is changed as shown by "V$_{ga}$" and "V$_{gb}$" in FIG. 5A. In this case, as shown in FIG. 5B, the transconductance gm cannot be maintained constant.

However, if the bias circuit according to the first embodiment of the present invention is used, the driving current or others is determined by the characteristics of the FET Q1 having the long gate length Lg, and therefore, an operation for maintaining the gm constant is performed. As a result, as shown in FIG. 5B, gate voltages "V$_{g1}$" and "V$_{g2}$" are generated.

By this bias change, the transconductance gm is controlled constant. Obviously, even if the bias circuit for maintaining the gm constant is inserted in only either an initial stage or a second stage, an improving effect can be obtained.

By such a behavior, the power amplifier capable of stably adjusting the gain can be achieved.

Second Application Example

Further, as another application example, the bias circuit according to the embodiments of the present invention is described.

Figure 6:
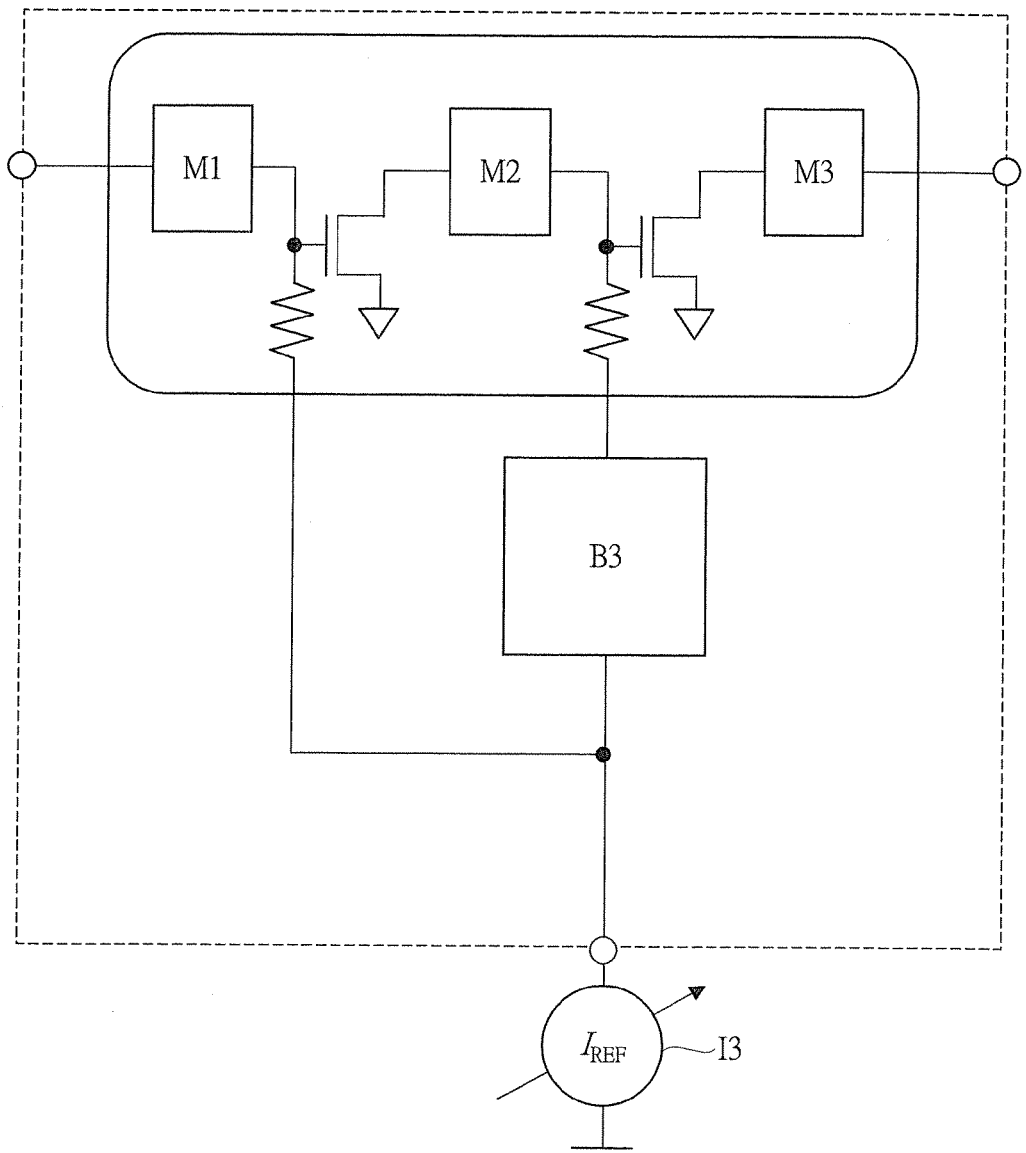
FIG. 6 is a configuration diagram showing a configuration of another power amplifier module to which the first embodiment or the second embodiment of the present invention is applied.
Figure 7A:
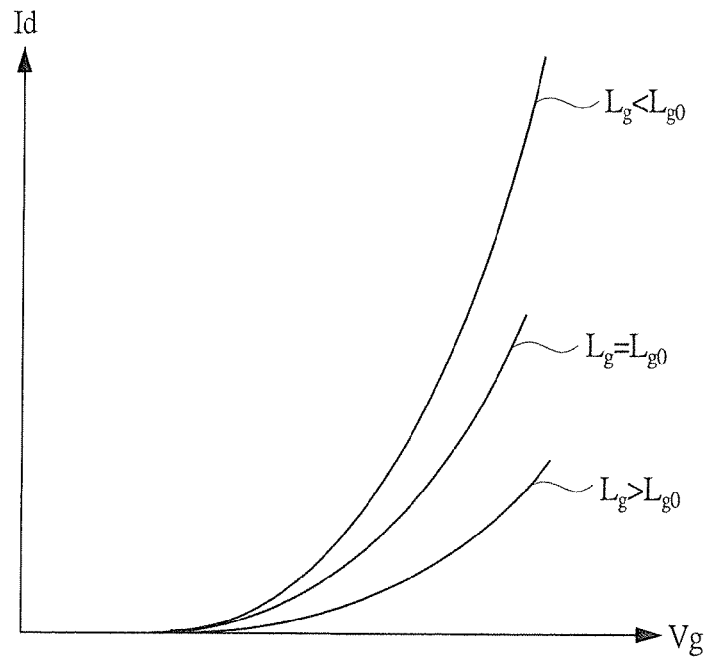
FIGS. 7A and 7B are conceptual diagrams each showing movement of a bias point of a transistor in an amplifier stage of the power amplifier of FIG. 6.
Figure 7B:
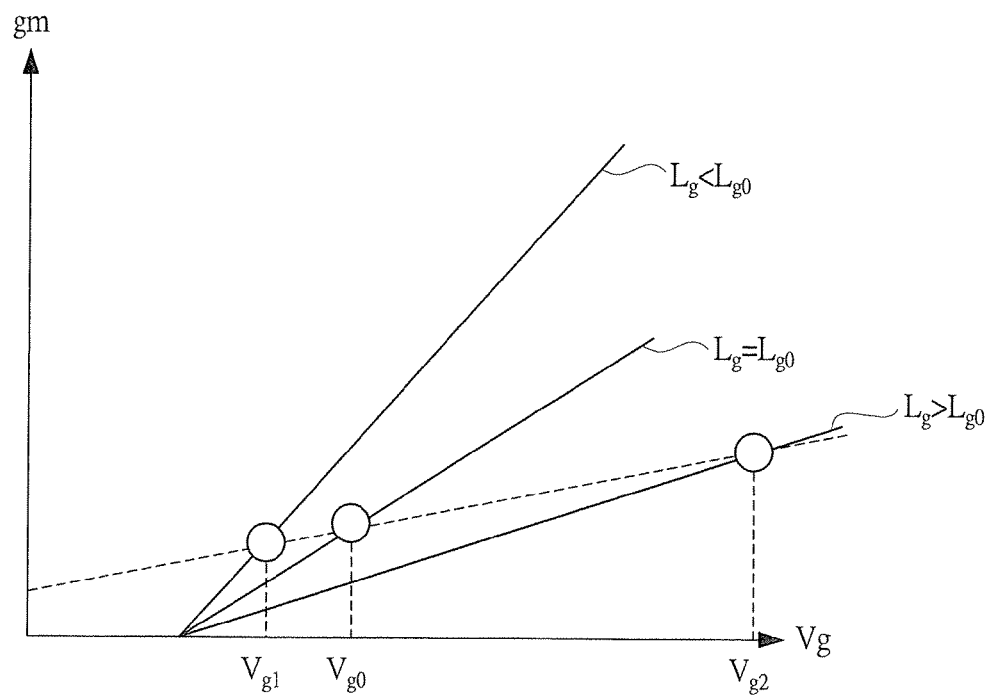

FIG. 6 is a configuration diagram showing a configuration of another power amplifier module to which the first embodiment or the second embodiment of the present invention is applied. And, FIGS. 7A and 7B are conceptual diagrams each showing movement of a bias point of a transistor in an amplifier stage. Note that, similarly to FIGS. 5A and 5B in the first application example, FIG. 7A is a graph showing correspondence between a voltage and a current, and FIG. 7B is a graph showing correspondence between a voltage and a transconductance.

This amplifier circuit is configured of amplifiers M1, M2 and M3, a bias circuit B1, and a constant current source I3.

In the first application example, the bias circuit for maintaining the transconductance gm constant as described in the first example is mounted in both of the initial stage and the second stage. Depending on the setting of the bias point, distortion increases due to the decrease in the gate voltage when the gate length is short. Here, a case that the bias in the initial stage is under such a condition is considered.

In the present application example, in order to avoid the distortion, the bias circuit for maintaining the gm constant is not mounted in the initial stage, but the bias circuit according to the second embodiment is mounted in the last stage. In this manner, the transconductance gm is controlled, so that the distortion also including the gain deviation for the initial stage is cancelled.

In this case, as shown in FIGS. 7A and 7B, the change of the gate bias voltage is much larger, and therefore, it should be taken into consideration that the bias point in the last stage has a margin against linearity.

In the present application example, the example of the usage in the last stage is described. However, conversely, depending on the bias setting, a circuit for controlling the gm can be provided in the initial stage.

As described above, by taking the distortion into consideration at a designing stage, the gain can be stably adjusted even only when one of the bias circuits of the present invention is applied to the power amplifier module which performs the multistage amplification.

A semiconductor device on which the power amplifier module described in these application examples is mounted, a wireless transceiver using the semiconductor device, and a mobile phone using the same are also within the scope of the present invention.

The invention claimed is:

1. A bias generation circuit comprising: a first current mirror circuit configured of a pair of NPN type transistors connected thereto; and a bias circuit operated based on an output current of the first current mirror circuit,
   a constant current being inputted to a collector terminal of a first transistor configuring the first current mirror circuit, and an input current to the bias circuit being outputted from a collector terminal of a second transistor configuring the first current mirror circuit, and
   a gate length of a base terminal of the second transistor being longer than a gate length of a base terminal of the first transistor.

2. The bias generation circuit according to claim 1, wherein an output current of the second transistor is inputted to the bias circuit through a second current mirror circuit.

3. A power amplifier module comprising: a first amplifier; a second amplifier; and a third amplifier, which are connected in series,
   a first bias generation circuit being arranged between the first amplifier and the second amplifier and a second bias generation circuit being arranged between the second amplifier and the third amplifier, and
   the bias generation circuit according to claim 2 being used as either one or both of the first bias generation circuit and the second bias generation circuit.

4. A semiconductor device comprising the power amplifier module according to claim 3.

5. A power amplifier module comprising: a first amplifier; a second amplifier; and a third amplifier, which are connected in series,
   a bias generation circuit being arranged between the first amplifier and the second amplifier or between the second amplifier and the third amplifier, and
   the bias generation circuit according to claim 2 being used as the bias generation circuit.

6. A semiconductor device comprising the power amplifier module according to claim 5.

7. A bias generation circuit comprising: a first current mirror circuit configured of a pair of NPN type transistors; a second current mirror circuit configured of a pair of PNP type transistors; and a bias circuit operated based on an output current of the second current mirror circuit,
   a constant current being inputted to a collector terminal of a first transistor configuring the first current mirror circuit, and an input current to the second current mirror circuit being outputted from a collector terminal of a second transistor configuring the first current mirror circuit,
   an output of the second transistor configuring the first current mirror circuit being inputted to a collector terminal of a third transistor configuring the second current mirror circuit, and an input current to the bias circuit being outputted from a collector terminal of a fourth transistor configuring the second current mirror circuit, and
   a gate length of a base terminal of the second transistor and a gate length of a base terminal of the fourth transistor being longer than a gate length of a base terminal of the first transistor and a gate length of a base terminal of the third transistor.

8. The bias generation circuit according to claim 7 wherein an output current of the second transistor is inputted to the second current mirror circuit through a third current mirror circuit, and an output current of the fourth transistor is inputted to the bias circuit through a fourth current mirror circuit.

9. A power amplifier module comprising: a first amplifier; a second amplifier; and a third amplifier, which are connected in series,
   a first bias generation circuit being arranged between the first amplifier and the second amplifier and a second bias generation circuit being arranged between the second amplifier and the third amplifier, and
   the bias generation circuit according to claim 7 being used as either one or both of the first bias generation circuit and the second bias generation circuit.

10. A semiconductor device comprising the power amplifier module according to claim 9.

11. A power amplifier module comprising: a first amplifier; a second amplifier; and a third amplifier, which are connected in series,
    a bias generation circuit being arranged between the first amplifier and the second amplifier or between the second amplifier and the third amplifier, and
    the bias generation circuit according to claim 7 being used as the bias generation circuit.

12. A semiconductor device comprising the power amplifier module according to claim 11.

13. A power amplifier module comprising: a first amplifier; a second amplifier; and a third amplifier, which are connected in series,
    a first bias generation circuit being arranged between the first amplifier and the second amplifier and a second bias generation circuit being arranged between the second amplifier and the third amplifier, and
    the bias generation circuit according to claim 1 being used as either one or both of the first bias generation circuit and the second bias generation circuit.

14. A power amplifier module comprising: a first amplifier; a second amplifier; and a third amplifier, which are connected in series,
    a bias generation circuit being arranged between the first amplifier and the second amplifier or between the second amplifier and the third amplifier, and
    the bias generation circuit according to claim 1 being used as the bias generation circuit.

15. A power amplifier module comprising: a first amplifier; a second amplifier; and a third amplifier, which are connected in series,
    a first bias generation circuit being arranged between the first amplifier and the second amplifier and a second bias generation circuit being arranged between the second amplifier and the third amplifier, and
    the bias generation circuit according to claim 8 being used as either one or both of the first bias generation circuit and the second bias generation circuit.

16. A power amplifier module comprising: a first amplifier; a second amplifier; and a third amplifier, which are connected in series,
    a bias generation circuit being arranged between the first amplifier and the second amplifier or between the second amplifier and the third amplifier, and
    the bias generation circuit according to claim 8 being used as the bias generation circuit.

* * * * *